(12) United States Patent
Kaishita et al.

(10) Patent No.: US 6,332,529 B1
(45) Date of Patent: Dec. 25, 2001

(54) COMPONENT CONVEYING DEVICE

(75) Inventors: Nikei Kaishita; Akira Nemoto; Shigeki Takahashi, all of Omihachiman (JP)

(73) Assignee: Murata Manufacturing Co., Ltd., Nagaokakyo (JP)

( * ) Notice: Subject to any disclaimer, the term of this patent is extended or adjusted under 35 U.S.C. 154(b) by 0 days.

(21) Appl. No.: 09/427,746

(22) Filed: Oct. 27, 1999

(30) Foreign Application Priority Data

Nov. 9, 1998 (JP) ................................... 10-317167

(51) Int. Cl.$^7$ .................................................. B65G 47/02
(52) U.S. Cl. ..................... 198/463.4; 198/690.1; 198/396; 198/459.1
(58) Field of Search ........................... 198/690.1, 750.13, 198/463.4, 459.6, 459.7, 396; 221/211, 212

(56) References Cited

U.S. PATENT DOCUMENTS 6,032,783 * 3/2000 Saito et al. ..................... 198/396 X
6,073,800 * 6/2000 Saito et al. ..................... 198/690.1

FOREIGN PATENT DOCUMENTS 8-048419 2/1996 (JP).

* cited by examiner

Primary Examiner—James R. Bidwell
(74) Attorney, Agent, or Firm—Burns, Doane, Swecker & Mathis, LLP

(57) ABSTRACT

A component conveying device can reliably separate a head component and a second component and can easily take out the head component. A guide groove for aligning and guiding a component P, a conveying member M which is arranged on a bottom surface of the guide groove and is movable forward and backward in the direction of the groove, and a driving means to provide backward and forward movement of the conveying member M are provided. The component P is conveyed forward by moving the conveying member forward in a low speed and moving the conveying member backward in a high speed. A first stopper S1 holds a second component P2 from the head component P1 conveyed on the conveying member M. After the first stopper S1 holds the second component P2, the conveying member M moves forward further, causing a head component P1 to move forward integrally with the conveying member M due to the frictional force, generated by the combined force of the attraction force of a magnetic force generating portion Mg and gravity, so that the head component P1 is separated from the second component P2.

13 Claims, 9 Drawing Sheets

COMPONENT CONVEYING DEVICE

BACKGROUND OF THE INVENTION

1. Field of the Invention

The present invention relates to a component conveying device, and more particularly to apparatus which separates a head component and a second component among the components conveyed by aligning in a single line.

2. Brief Description of the Related Art

Conventionally, as a conveying device of small components like chip components, an apparatus has previously been proposed in which a bottom surface of a groove for conveying and guiding the components includes an endless belt and the components are conveyed by intermittently driving the endless belt. (See Japanese Patent Laid-open No. 8-48419). In the case of this apparatus, in order to take out a head component, a mechanism is provided that separates the head component on the belt from a second component. When the component on the belt moves forward along with the belt, this separation mechanism moves a stopper into contact with a front end of the guide groove and stops the head component in a fixed position. When the head component is in contact with the stopper and movement of the entire component stops, the stopper is released forward while holding the second component in position by a hold pin, and the head component is made to move forward by a permanent magnet in the stopper. A gap is forcibly formed between the second component and the head component, and the separated head component is taken out by an extractor, such as a chip mounter.

However, in the separation mechanism described above, in which the head component is moved by the permanent magnet provided in the stopper, when the belt stops and is pulled out forward by the magnetic force, friction occurs between the component and the belt when pulling out the head component, and the force between the permanent magnet and the component may decrease. Therefore, there is a problem, in that the separation reliability is insufficient.

Thus, an objective of the present invention is to provide a component conveying device which can reliably separate the head component from the second component and can easily take out the head component.

SUMMARY OF THE INVENTION

According to a first exemplary embodiment of the present invention, a device useful for conveying a component which is magnetically attractable comprises a guide groove for guiding and aligning a component in a single line, the guide groove extending along a longitudinal direction and including a bottom surface and a tip portion. A conveying member is disposed on the bottom surface of the guide groove and has a magnetic force generating element for magnetically attracting the component, the conveying member being longitudinally movable in the groove to convey the component forward, and a driving means for reciprocally and longitudinally driving the conveying member. A first stopper is movable in synch with the reciprocating movement of the conveying member for holding a second component in a fixed position in the guide groove. After the first stopper holds the second component, when the conveying member moves longitudinally forward by a predetermined distance, a first component is integrally conveyed forward with the conveying member by a total friction force from the combined force of the attraction power of the magnetic force generating element and gravity, thereby isolating the first component from the second component.

According to a second exemplary embodiment of the present invention, a method of conveying a component comprises the steps of aligning a first component having a magnetic part in a single line to guide the first component to a guide groove, conveying the first component forward by a conveying member disposed on a bottom surface of the guide groove, the conveying member having a magnetic force generating element for attracting the magnetic part of the first component and moving backward and forward in the groove direction, holding a second component at a predetermined position of the guide groove by a first stopper which operates in synch with the backward and forward movement of the conveying member, and moving the conveying member forward by a predetermined distance, the first component being attracted by the magnetic force generating element and being conveyed forward integrally with the conveying member, so that the first component is separated from the second component.

Still other objects, features, and attendant advantages of the present invention will become apparent to those skilled in the art from a reading of the following detailed description of embodiments constructed in accordance therewith, taken in conjunction with the accompanying drawings.

BRIEF DESCRIPTION OF THE DRAWINGS

The invention of the present application will now be described in more detail with reference to preferred embodiments of the apparatus and method, given only by way of example, and with reference to the accompanying drawings, in which:

FIG. 6(a) illustrates an open state of the component, while FIG. 6(b) illustrates the state of holding the component;

DESCRIPTION OF THE PREFERRED EMBODIMENTS

Figures 1A, 1B, 1C, 1D, 1E:
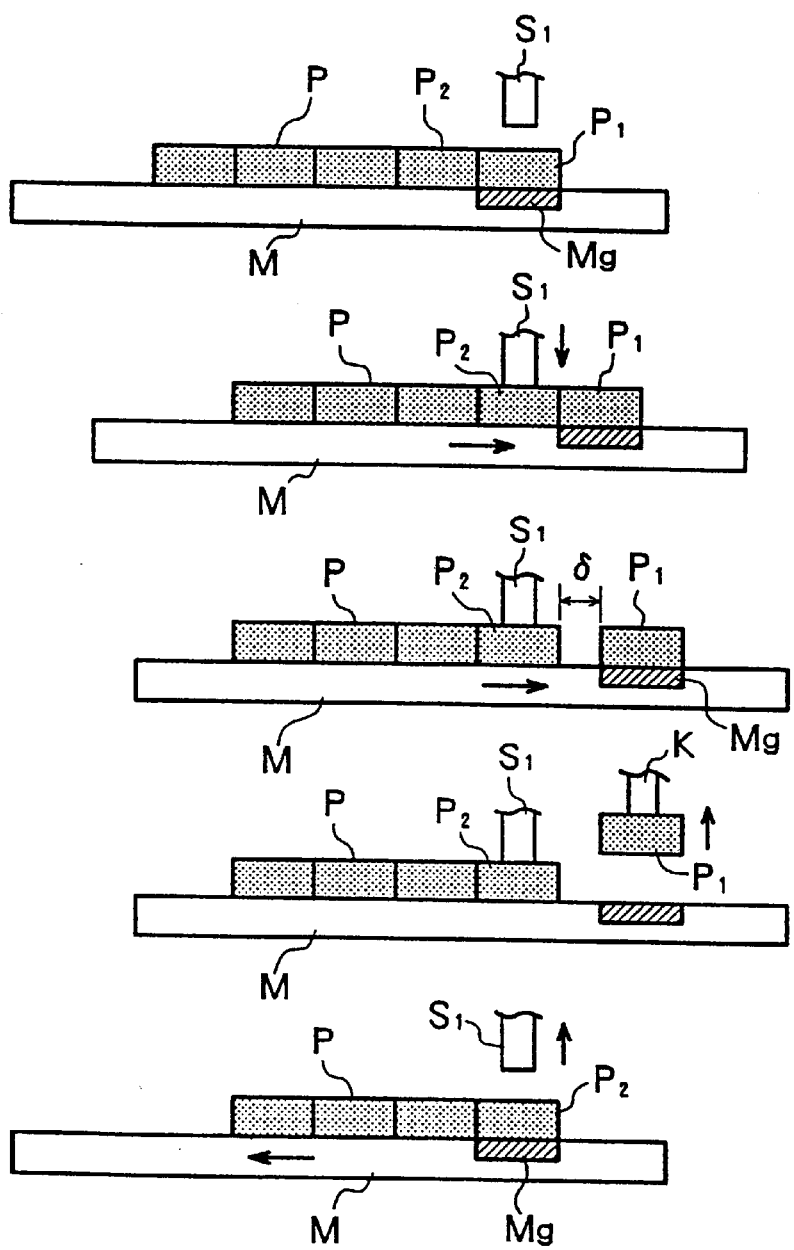
FIGS. 1(a)–(e) illustrate a principle of operation of a component conveying device according to one aspect of the present invention.

Referring to the drawing figures, like reference numerals designate identical or corresponding elements throughout the several figures.

FIGS. 1(a)–1(e) (together, FIG. 1) illustrate an operation principle of an exemplary component conveying device in accordance with a first embodiment of the present invention.

FIG. 1 (a) illustrates an initial position, in which the surfaces of both sides of components P are guided by a guide groove (not shown), and the components P are aligned. A conveying member M, which is movable forward and backward (right and left in FIG. 1, respectively), is arranged on the bottom surface of the guide groove. The components P are on the conveying member M and a first stopper S1 (illustrated in an open state) is positioned to the side of a first or head component P1. In FIG. 1, the first stopper S1 is shown above the components P. However, in fact, stopper S1 is positioned to the side of the component P. A magnetic force generating part Mg for attracting the component P1 is provided in a position of the conveying member M which corresponds to the head component P1. The components P are magnetically attractable, e.g., include a magnetic part.

FIG. 1 (b) illustrate a state where the conveying member M has moved forward only by one pitch, i.e., by the length of one component P. The component P moves forward integrally with the conveying member M due to the friction force by gravity and the friction force by the attraction power of the magnetic force generating portion Mg. In this step, the first stopper SI is operated in a closing direction to push against and hold the second component P2 in the inner surface of the guide groove, and blocks the forward movement of the second component P2 and the components behind the second component.

FIG. 1 (c) illustrates a state where the conveying member M is made to move forward further. At this time, the head component P1 moves forward with the conveying member M. However, since the second component P2 and the components P following behind the second component are constrained by the first stopper S1, a relative skid is produced between the conveying member M and the second component P2 and the components P following thereafter. As a result, a gap (δ) is formed between the head component P1 and the second component P2.

FIG. 1 (d) illustrates a state where the head component P1 is taken out using an extractor K, such as a chip mounter readily appreciated by one of ordinary skill in the art. At this time, since the gap (δ) is provided between the head component P1 and the second component P2, there is no possibility that the second component P2 may be accidentally taken out with the first component P1.

FIG. 1(e) illustrates a state where the conveying member M has been retracted. At this time, some return setting is performed so that the components P may not retreat together with the conveying member M. As a result, the components P skid relative to the conveying member M, only the conveying member M retreats, and the components P are maintained in the forward position.

By repeating the operation of (a) to (e), the components P are intermittently conveyed forward while being aligned in a single line, and every piece is sequentially taken out starting with the head component P1.

In the present invention, the head component is not forwardly removed by a magnetic force, as in the prior art. Since the lead component is made to move forward with the conveying member, using the friction force generated by the conveying member, the head component and the consecutive components can be reliably separated. As the friction force generated by the attraction power of the magnetic force generating portion is also applied to the conveying member, in addition to the friction force by gravity of the component, it is possible to obtain a large friction force. Even if conveyed at a velocity exceeding the movement critical speed of the friction holding power achieved by gravity, the components can nonetheless be separated without the components sliding. As for a magnetic force generating portion of this invention, a permanent magnet may be attached to a part of the conveying member. Alternatively, the whole conveying member may be a magnetic force generating portion by forming the conveying member itself from a ferromagnetic material, and carrying out magnetization of this conveying member.

Advantageously, a position of the magnetic force generating part is the position of a portion of the conveying member M which corresponds to the head component P1 when holding the second component P2 with the first stopper S1, as described above with respect to the second step of the invention (See FIG. 1 (b)), since the head component P1 can be reliably pulled apart from the second component P2 when making the conveying member M move forward.

Further advantageously, a system in accordance with the present invention conveys a component in one direction by the conveying member, and provides a speed difference between moving the conveying member forward and backward. That is, a driving mechanism or means carries out bidirectional movement of the conveying member so that the speed of moving backward may become larger than the speed of moving forward. The speed of moving the conveying member forward is considered to be a velocity in which only the friction force making the component move integrally with the conveying member works between the conveying member and the component thereon. The speed of moving the conveying member backward is considered to be a velocity in which a skid is produced between the conveying member and the component thereon. Thus, the driving mechanism or means can be simplified since the component can be conveyed in one direction only by carrying out reciprocal movement of the conveying member, and the damage caused to the component is little, since the component is not constrained. In addition, regarding the speed of moving the conveying member forward, not only do the conveying member and the component move completely integrally together, but the two can be caused to skid relative to each other. Moreover, the backward speed is sufficiently high that it preferably is higher than the velocity at which the friction force does not move a component at all, and the velocity is at least high enough so that the component does not retreat substantially even when some friction force would otherwise produce some backward movement.

In yet another aspect of the present invention, a second stopper, movable forward and backward which stops the head component, is provided in an end part of the guide groove. Just before the completion of the forward movement of the conveying member, the second stopper may be preferably moved forward following along with the conveying member, and the second stopper may be preferably moved backward following the backward movement of the conveying member. In this case, since it is made to move forward, contacting the head component with the second stopper, the extraction position of the head component is located with high precision, and extraction of the head component becomes easier. Moreover, in the event that the head component remains on the conveying member by an extraction mistake, separation and extraction can be performed many times by putting back the head component with the second stopper to the position where the head component contacts the second component. Therefore, supply of the components can be continued, without stopping the whole apparatus, even when an extraction mistake occurs.

FIGS. 2(a)–(g) (together, FIG. 2) illustrate an example of an operation principle of an exemplary component conveying device in accordance with yet another aspect of the present invention.

Figure 2A:
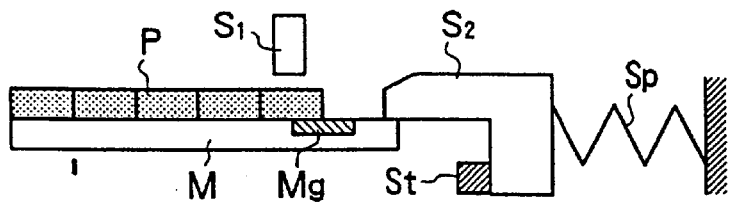
FIGS. 2(a)–(g) illustrate a principle of operation of a component conveying device according to another aspect of the present invention.

FIG. 2(a) illustrates an initial position and a second stopper S2 positioned at a predetermined distance from the conveying member M. The second stopper S2 is biased backward with a spring Sp, and the backward movement is limited by a stoppage member St.

Figure 2B:
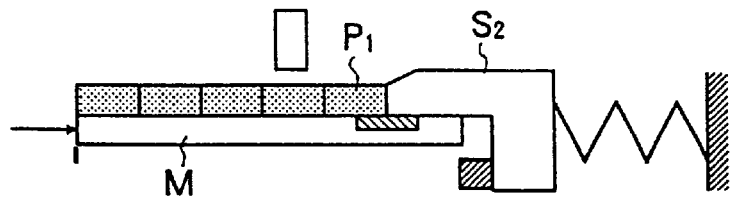

FIG. 2(b) illustrates a state in which the conveying member M has moved forward by one pitch. At this point a head component P1 is in contact with the second stopper S2. In a manner similar to that described above with reference to FIG. 1, the components P move integrally forward with the conveying member M at least in part because of the friction force by gravity and the friction force by the attraction power of the magnet Mg.

Figure 2C:
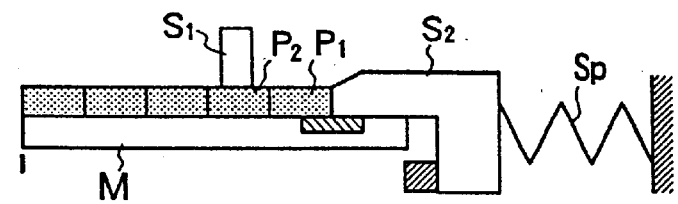

FIG. 2(c) illustrates a state in which the first stopper S1 is operated in the closing direction and the second component P2 is pushed against the inner surface of the guide groove to be held therein. Forward movement of the second component P2 and the components behind it is therefore blocked, as described above.

Figure 2D:
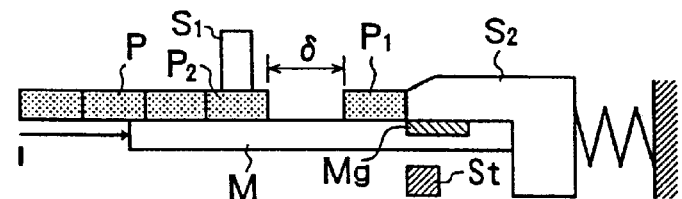

FIG. 2(d) illustrates a state where conveying member M is made to move forward further by a predetermined distance. At this time, the head component P1 moves forward with the conveying member M until it comes into contact with the second stopper S2. However, since the second component P2 and the components P behind it are constrained by the first stopper SI, a gap (δ) is produced between the head component P1 and the second component P2. In addition, while moving from (C) to (D), the front surface of the conveying member M contacts with the rear surface of the second stopper S2, and the second stopper S2 is pushed toward the conveying member M and moves forward. Therefore, the amount of movement of the second stopper S2 is smaller than the amount of movement of the conveying member M while moving from (C) to (D).

Figure 2E:
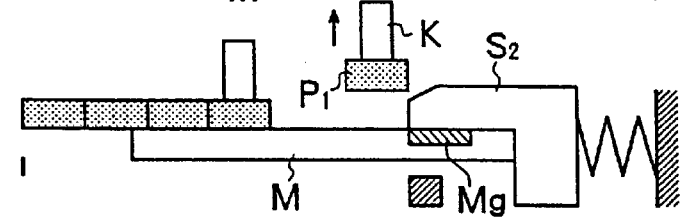

FIG. 2(e) illustrates a state in which the head component P1 is taken out using an extractor K. At this time, since the gap (δ) is provided between the head component P1 and the second component P2, there is no possibility that the second component P2 may be accidentally taken out with the first component.

Figure 2F:
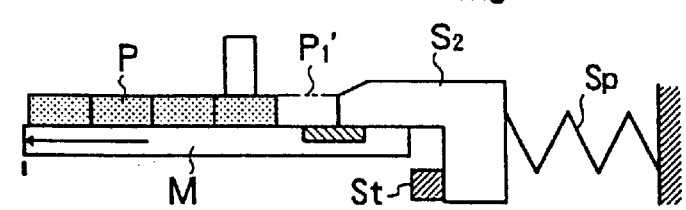

FIG. 2(f) illustrates a state in the middle of moving conveying member M backward. At this time, some return setting is performed so that the components P may not retreat together with the conveying member M. As a result, the components P slip relative to the conveying member M, only the conveying member M retracts, and the components P are maintained in the advance position. In addition, since the second stopper S2 is biased backward by the spring Sp, the second stopper retracts following retraction of the conveying member M.

Figure 2G:
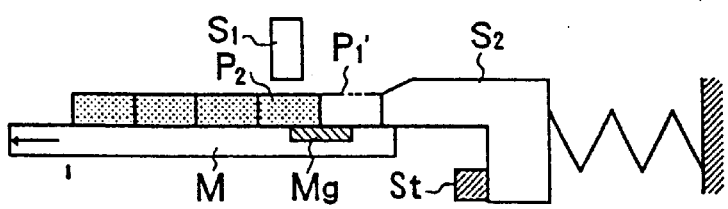

FIG. 2(g) illustrates a state in which the conveying member M has been returned to the initial position. During this retraction, the second stopper S2 stops by being contacted by a stoppage member St. Thus, even if a mistake occurs the extraction of the head component P1, the head component P1 and the second component P2 are separated upon subsequent advancement of the conveying member M.

In addition, the position of magnetic force generating portion Mg provided in the conveying device M is in the vicinity of the end of conveying device M in FIG. 2. It is constructed so that when taking the head component P1 out with an extractor K, the magnetic force generating portion Mg may "hide behind" or be obstructed by the back side of the second stopper S2. As a result, at the time of extraction of the head component P1, the attraction power of the magnetic force generating portion Mg does not work as strongly on the head component P1, thus resulting in a decrease in extraction mistakes.

FIGS. 3 to 9 illustrate an example of a component conveying device in accordance with the present invention. In addition, in this example, a chip electronic component of a rectangular, parallelepiped shape and which has magnetic electrodes in both ends thereof is used as a component P.

Figure 3:
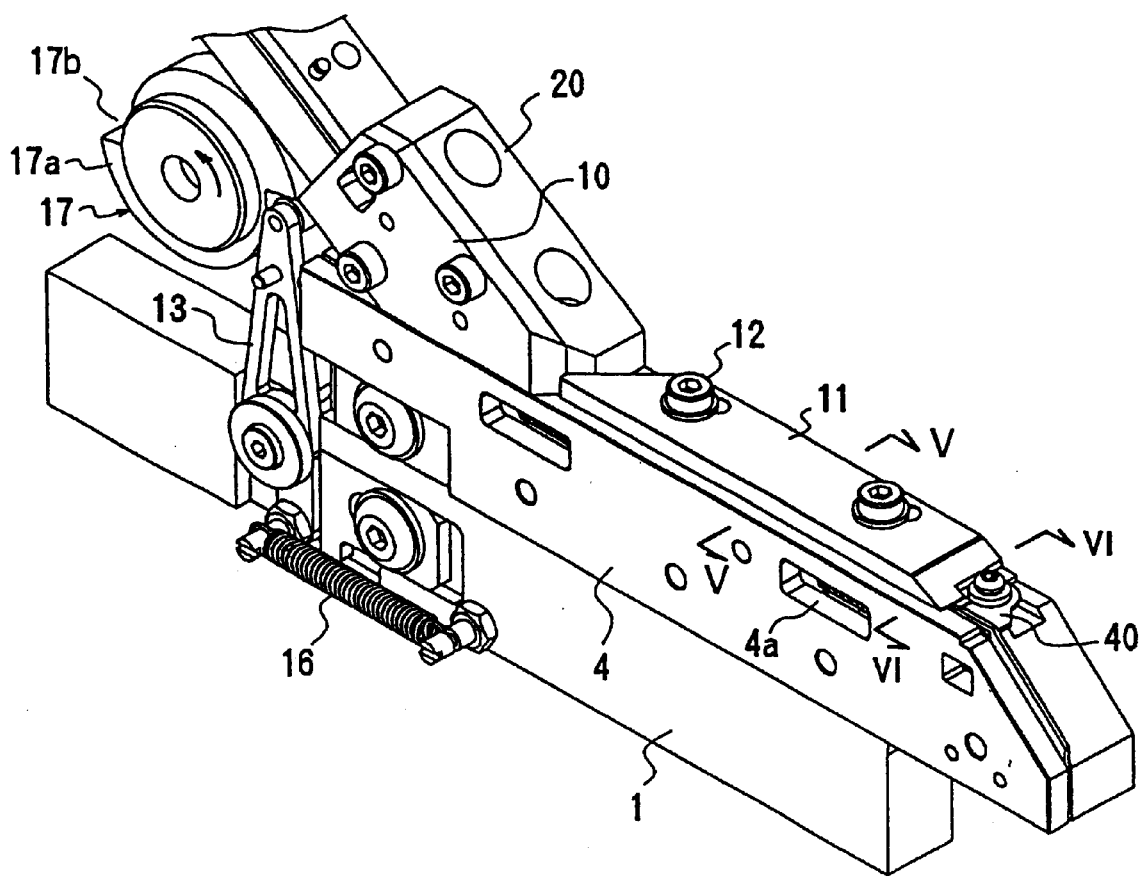
FIG. 3 illustrates a perspective view of an example of a component conveying device in accordance with the present invention.
Figure 4:
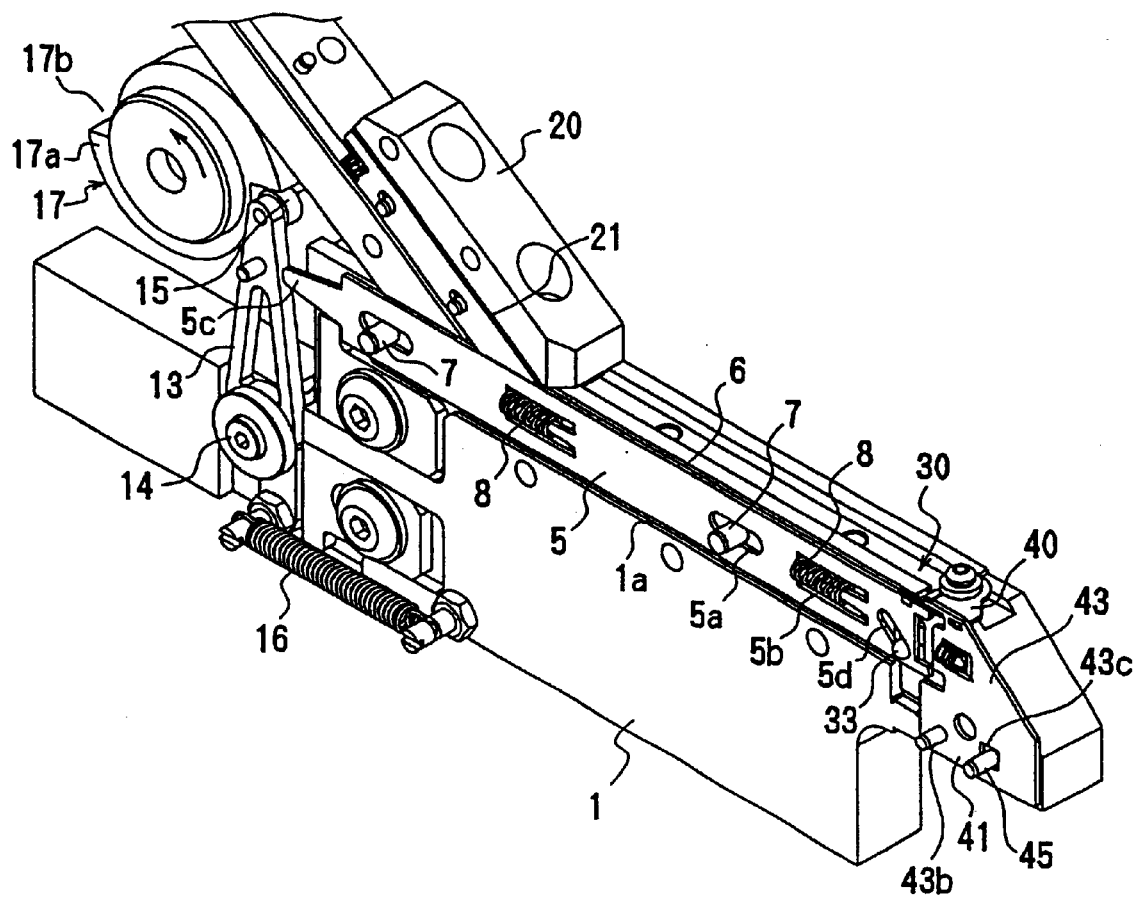
FIG. 4 illustrates a perspective view in which a front cover and an upper cover of the component conveying device shown in FIG. 3 are removed.
Figure 5:
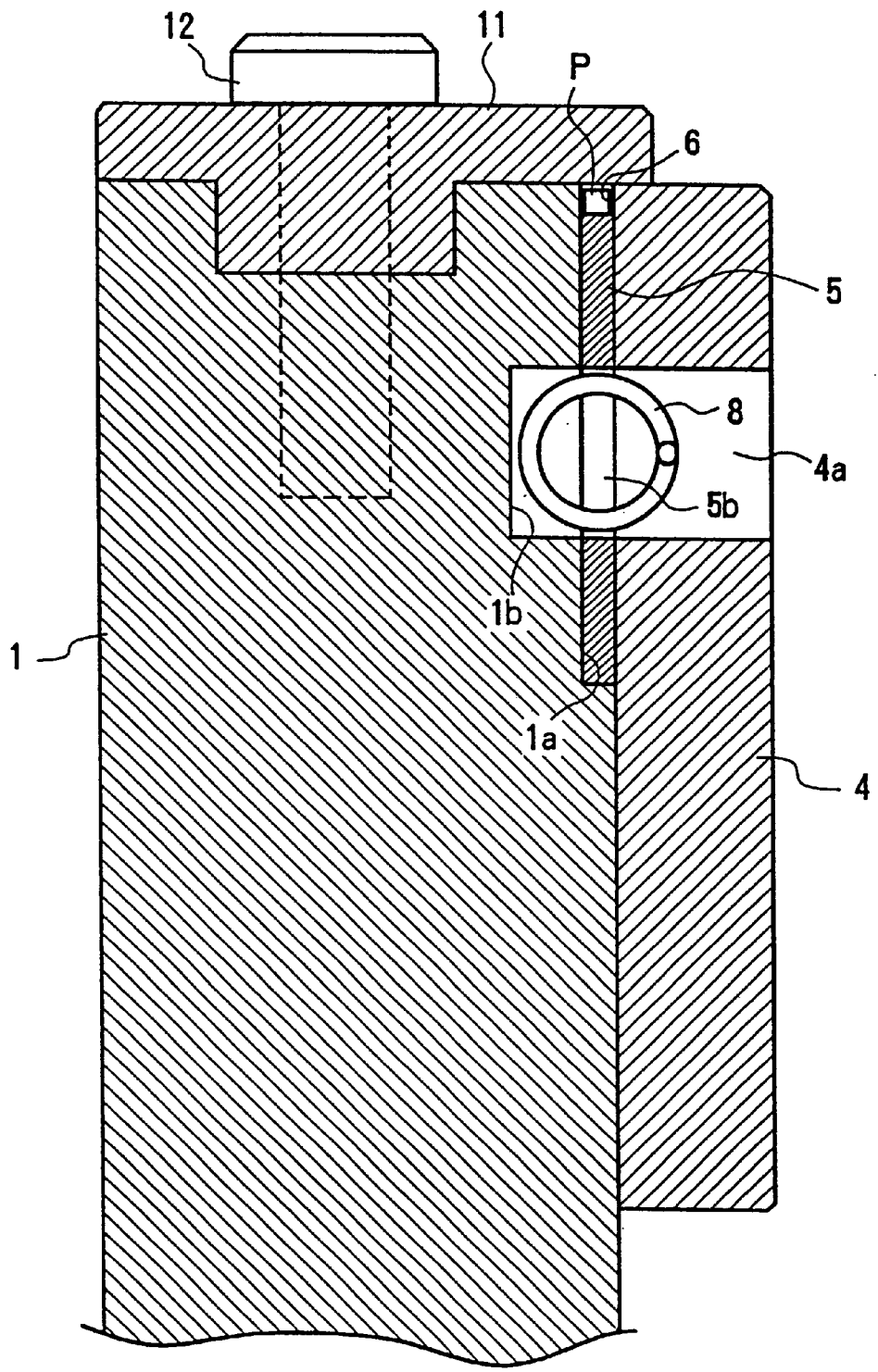
FIG. 5 illustrates a cross-sectional view, taken along line V—V in FIG. 3.

FIG. 3 illustrates a general view of an exemplary apparatus. FIG. 4 illustrates a state where front covers 4 and 10 and an upper cover 11 have been removed.

As illustrated in FIG. 4, a concave step 1a is formed on a front surface of a main body 1, and a narrow space is formed by fixing the front cover 4 to the front surface of the main body 1. A blade 5, which is an example of a conveying member, is horizontally and slidably arranged in this space. A top cover 11 is fixed to the upper surface of the main body 1 with a screw 12 so that the component P may not jump out at the time of conveyance. A guide groove 6 for aligning and guiding the component P is formed by an inner surface of concave step 1a, an inner surface of the front cover 4, the upper surface of the blade 5, and the lower surface of the upper cover 11. In addition, the main body 1, which includes the guide groove 6, the front cover 4, the blade 5, and the upper cover 11, is formed of non-magnetic materials.

The blade 5 is formed, for example, by the thin plate-like metal plate, and as shown in FIG. 4, includes a longitudinally (front and back) extending long hole 5a and a spring receipt hole 5b. A guide pin 7 protruding from the main body 1 is inserted in long hole 5a to guide the blade 5 in the front and back direction. Moreover, a spring 8 is accommodated in the spring receipt hole 5b. Both radial sides of this spring 8 are engaged by a concave groove 1b formed on the main body 1 and an aperture hole 4a (see FIG. 5) formed on the front cover 4. The rear surface of the spring 8 is supported by the spring receipt hole 5b, and the front surface thereof is supported by the front end surface of the concave groove 1b and the aperture hole 4a. The blade 5 is thus always biased backward.

A rear end part 5c of the blade 5 is in contact with the front surface of a middle lever 13 which is pivotally attached in the main body 1 and pivots or rocks by the spring power of the spring 8. A center section of middle lever 13 is rockably supported by a screw 14, and a roller 15, which is in rolling contact with the surrounding surface of a cam 17, is provided at the upper end part of the middle lever. One end of a spring 16, whose other end is fixed to the main body 1, is fixed to the lower end part of the middle lever 13. Therefore, the middle lever 13 is urged in the direction in which the roller 15 of the upper end part is in contact with the outer, surrounding surface of the cam 17. The spring 8, the middle lever 13, and the cam 17 together constitute a driving mechanism or means which carries out directional driving of the blade 5.

As illustrated in FIGS. 3 and 4, the cam 17 includes a crest part 17a and a trough 17b, and rotational driving is carried out at a fixed velocity in the direction of the arrow by a motor (not illustrated). Therefore, the blade 5 moves forward at a low speed as the roller 15 of the middle lever 13 engages the crest part 17a of the cam 17. When the roller 15 falls into the trough 17b of the cam 17, the blade 5 is retracted at a high rate of speed. The advance velocity of the blade 5 is selected as the velocity at which the holding friction force, which allows the components P to move integrally with the blade 5, works between the blade 5 and the components P thereon due to the inclination of the crest part 17a of the cam 17 and the rotational speed of the cam 17. Moreover, the retraction velocity of the blade 5 is selected as the velocity at which the blade 5 and the components P thereon slide or skid relative to each other. Thus, the blade 5 is made to move forward at a low speed during advancement so that the friction force may work, and the blade 5 is made to retract at a high speed during retraction so that the components can skid. Thus, the components P can be conveyed in one direction, without the need of providing an additional retraction prevention mechanism.

In the top edge of the front end part of the blade 5, a permanent magnet 3 (see FIG. 7 and FIG. 8), which is a magnetic force generating part, is embedded and fixed. Since the attraction power of this permanent magnet 3 works as a power by which the components P are stuck to the blade 5, due to the total friction force resulting from the force on gravity of the components P and the attraction power of the permanent magnet 3, the components P can be integrally advanced with the blade 5. Preferably, if the fixed position of the permanent magnet 3 is the position of the blade 5 which corresponds to the first or lead component P1 when a first stopper 31 (described below) holds the second component P2, a gap (δ) can reliably be formed between the head component P1 and the second component P2 when the blade 5 is made to move forward.

An alignment apparatus 20 for aligning the components P is fixed to the rear upper surface of the main body 1 in a slant direction. A chute groove 21, by which the component P slides downward along its inclination, is formed on the alignment apparatus 20 and a front cover 10 is fixed so that it covers the front surface of chute groove 21. The lower end part of the chute groove 21 is connected with the rear end part of the guide groove 6, and the components P which slide on the chute groove 21 enter into the guide groove 6. Since there is a difference in the angles between the chute groove 21 and the guide groove 6, components P in the guide groove 6 are prevented from returning to the chute groove by components P disposed in the lower end of the chute groove.

A separation mechanism 30 for separating the conveyed head component from the components behind the head component is provided at the front end part of the guide groove 6.

Figure 6A:
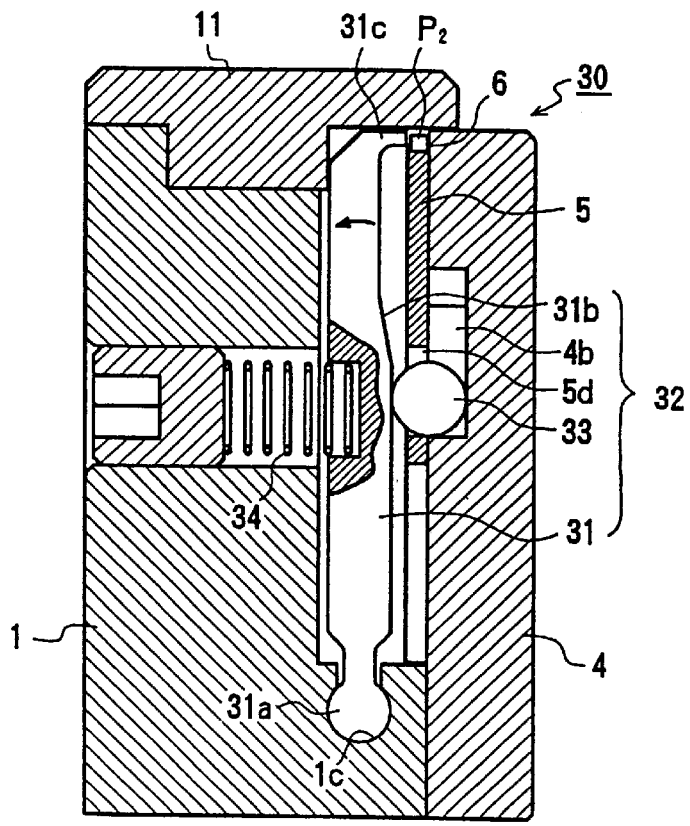
FIGS. 6(a) and 6(b) illustrate cross-sectional views, taken along line VI—VI in FIG. 3.
Figure 6B:
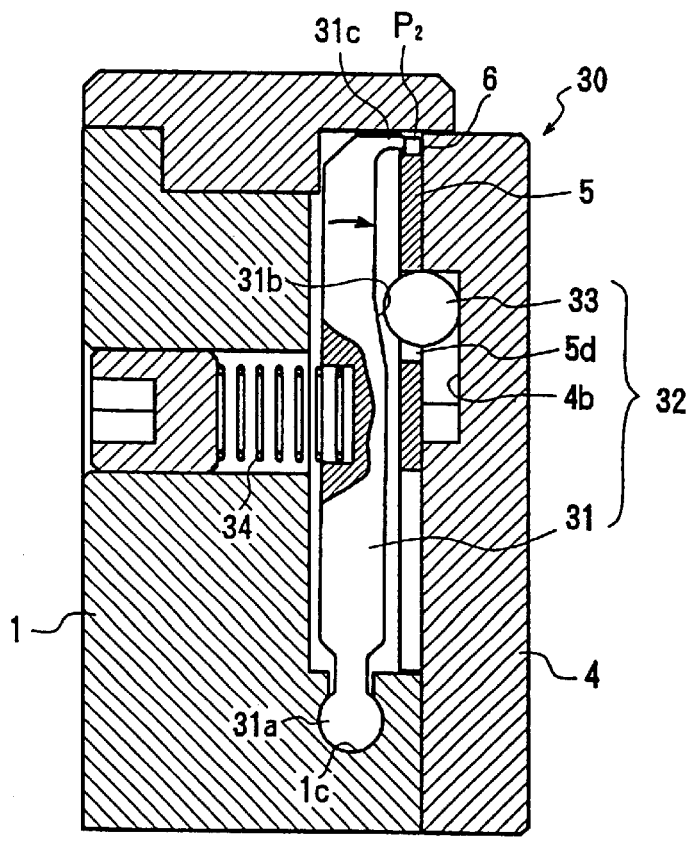
Figure 7:
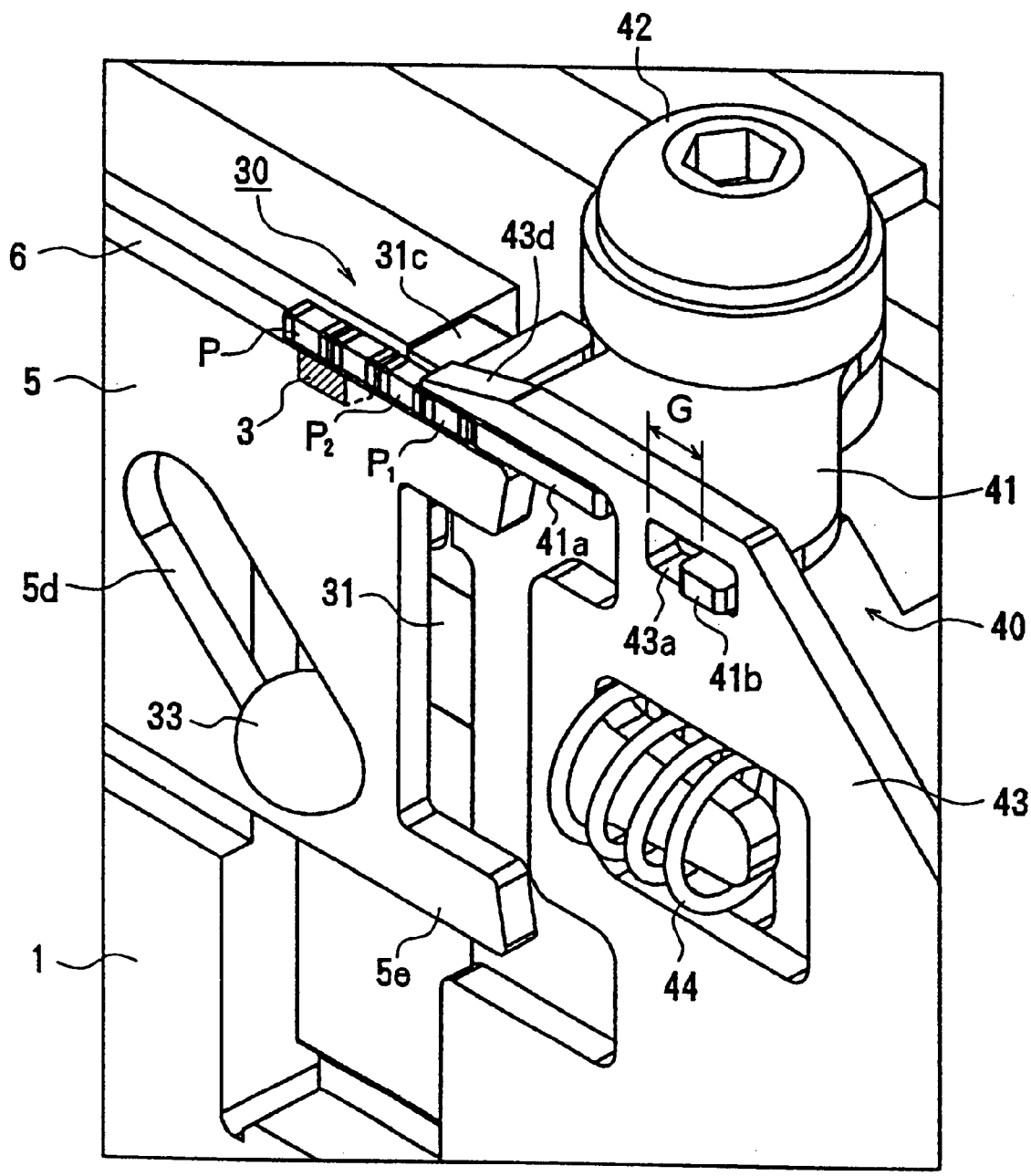
FIG. 7 illustrates an enlarged perspective view before separation of a separation mechanism.
Figure 8:
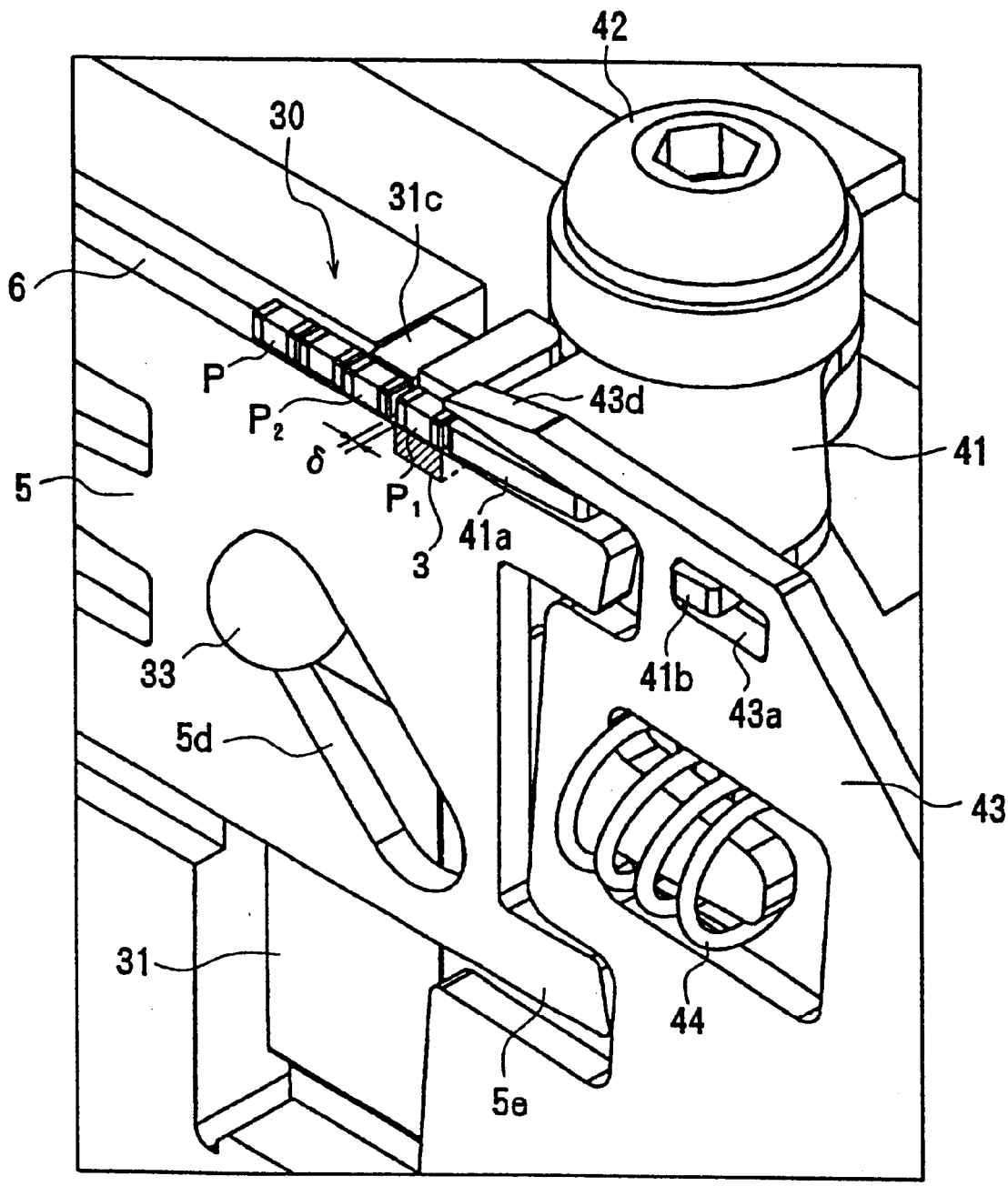
FIG. 8 illustrates an enlarged perspective view after separation of the separation mechanism.

The separation mechanism 30 has a first stopper 31 which holds the second component P2 from the head component P and a synchronization mechanism or means 32 which synchronizes with the forward and backward movement of the blade 5 and causes the first stopper 31 to oscillate (i.e., an opening-closing motion), as shown in FIGS. 6–8. The lower end part 31a of the first stopper 31 is supported by a recess 1c of the main body 1, and the cross section of the recess 1c has a circular shape. The first stopper 31 is pivotable or rockable in the transverse direction of the guide groove 6.

The synchronization mechanism 32 of this example is provided in the end part of the blade 5 and includes a first slot 5d which is inclined to the longitudinal direction, a second slot 4b extending in the up-down direction formed in the inner surface of the front cover 4 which guides side surfaces of the blade 5, a ball 33 inserted into the first slot 5d and the second slot 4b, an inclination surface 31b in the vertical direction which is formed in the lateral side surface of the first stopper 31 and contacts the ball 33, and a spring 34 which engages and laterally biases the first stopper 31 in a component holding direction.

When the blade 5 is in a retracted position, as shown in FIG. 6(a) and FIG. 7, the ball 33 is positioned in the lower end part of the first slot 5d and the second slot 4b. Therefore, the ball 33 is positioned below the inclination surface 31b of the first stopper 31 and pushes the first stopper 31 in the opening direction (to the left in FIG. 6(a)). As a result, the component P2 in the guide groove 6 is not supported.

When the blade 5 moves forward, because of the difference in angles between the first slot 5d and the second slot 4b, as shown in FIG. 6(b) and FIG. 8, the ball 33 moves upwards. The ball 33 is aligned with the inclination surface 31b of the first stopper 31. Therefore, the opening force against the first stopper 31 is released and the first stopper 31 is moved in the closing direction by the spring 34. The component P2 is supported between the end part 31c of the first stopper 31 and the inner surface of the guide groove 6.

Furthermore, when the blade 5 retracts, the ball 33 is moved downward because of the difference in angles between the first slot 5d and the second slot 4b, and the ball 33 engages against the inclination surface 31b of the first stopper 31 and laterally pushes the first stopper 31 to open against the force of spring 34. Therefore, the component P2 in the guide groove 6 can move freely.

As illustrated in FIGS. 7 to 9, an escape mechanism 40, which puts back the head component P1, is provided in the front end part of the guide groove 6, so that the stoppage position of the head component P1 may be fixed when separating the head component P1 and the second component P2 and that a gap (δ) can be formed between the head component P1 and the second component P2 even when a mistake occurs in extraction of the head component P1.

The escape mechanism 40 includes a second stopper 41 rotatably centered a shaft 42 at the end point of the guide groove 6, and an interlocking member 43 which rotates the second stopper 41 forward. Interlocking member 43 synchronizes with the blade 5 just before completion of forward movement of the blade 5, and rotates the second stopper 41 backward following backward movement of the blade 5. Rotation resistance is given to the second stopper 41 by a friction member (not illustrated). A first convex part 41a, which stops the head component, and a second convex part 41b are provided in the second stopper 41. The interlocking member 43 serves as a shutter which interlocks the second stopper 41 to the blade 5 and forms a fixed gap G. This gap G is formed by a gap between a hole 43a provided in the shutter 43 and the second convex part 41b. The shutter 43 is pivotable or rockable in the front and back direction, centered on a rotation shaft 43b (See FIG. 9), and is biased backward (the opposite direction to the blade 5) by a spring 44. In addition, as shown in FIG. 4, a pin 45 which protrudes from the main body 1 is inserted in the hole 43c of shutter 43, and thus the oscillation angle of the shutter 43 is regulated. A cover part 43d, which covers the upper side of the head component P1, is integrally formed on the upper end part of the shutter 43. Until just before the head component P1 is taken out from the guide groove 6, the upper side of the head component P1 is closed, and the head component is prevented from jumping out from the guide groove 6.

Figure 9A:
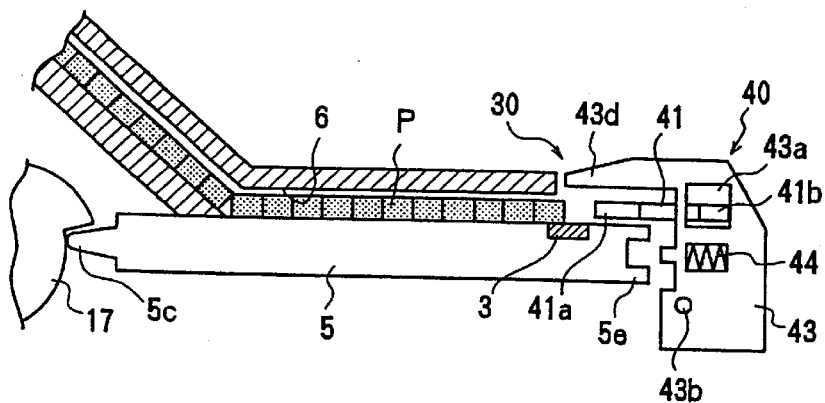
FIGS. 9(a)–9(c) illustrate an explanatory operation of an escape mechanism in accordance with the present invention.
Figure 9B:
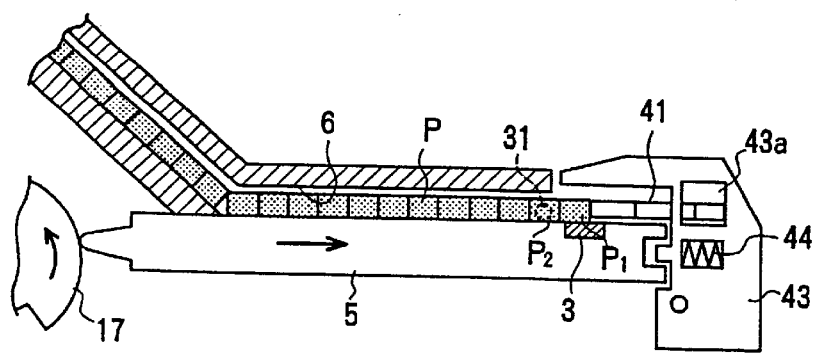
Figure 9C:
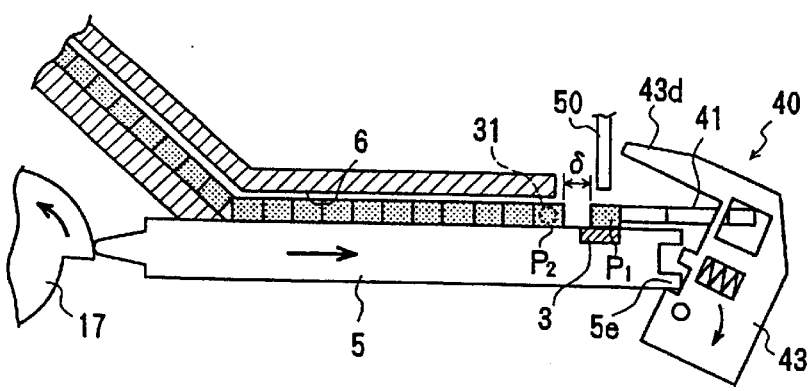

Turning now to FIGS. 9(a)–(c) (together, FIG. 9), the operation of the above escape mechanism 40 is explained.

FIG. 9(a) illustrates an initial state of the mechanism. The blade 5 moves forward from this position by the cam 17 at a low speed, and the components P on the blade 5 are advanced together.

FIG. 9(b) illustrates a state where a front end part 5e of the blade 5 approaches the shutter 43. The head component P1 contacts with the rear surface of the first convex part 41a of the second stopper 41. In this position, the second component P2 is pushed against the inner lateral surface of the guide groove 6 and is held by the first stopper 31.

If the blade 5, from the position illustrated in FIG. 9(*b*), moves further forward, as the second component P2 is held by the first stopper 31, the head component P1 moves forward with the blade 5 while contacting with the rear surface of the first convex part 41*a* of the second stopper 41, and is separated from the second component P2. Since a front end part 5*e* of the blade 5 pushes the shutter 43, in connection with advancement of the blade 5, the shutter 43 also rotates forward. However, the second stopper 41 does not rotate in synch with the shutter 43, and begins to rotate behind by a gap G between the hole 43*a* and the second convex part 41*b*.

FIG. 9(*c*) illustrates when the blade 5 has reached the front end position. Since the contact point of the shutter 43 and the front end part 5*e* of the blade 5 is in the vicinity of the position of the rotation shaft 43*b*, the moving speed of the cover part 43*d* of the shutter 43 is larger than the moving speed of the blade 5, and the cover part 43*d* of the shutter 43 is set up so that it may open just before the blade 5 reaches the front end position. Thus, since the head component P1 is separated from the second component P2, the head component P1 is held in contact with the rear surface of the second stopper 41, and the cover part 43*d* is in the open state, the head component P1 can simply be taken out by an extractor 50, such as a mounter.

In addition, in the event of an extraction mistake by the extractor 50, as shown in FIG. 2, separation can be again performed by putting the head component P1 back to the position of the second component P2 by action of the second stopper 41.

A driving mechanism or means which carries out bidirectional actuation of the conveying member (blade 5), is not restricted to the combination of the spring 8 as shown in FIG. 4, the middle lever 13, and the cam 17. Instead the middle lever 13 may be omitted, and the rear end part of the blade 5 may be contacted directly with the surrounding surface of the cam 17. Moreover, other mechanisms, such as a rack-and-pinion mechanism, may be adopted instead of a cam. Furthermore, the source of actuation is not restricted to a rotational movement mechanism, such as a motor, but may be a mechanism with a straight line motion.

As a method of conveying a component in one direction, friction generated by the speed difference between the conveying member (blade) and the component is utilized in the example. However, instead of this method, for example, a retraction prevention mechanism of a certain component may be provided in the rear of the guide groove.

The first stopper 31 is not restricted to one which carries out opening-closing operation in the lateral direction of the guide groove 6 and supports between the inner surfaces of the guide slot 6, but may support both side surfaces of the component. Or, holding of the second component may be accomplished by air suction as will be readily apparent to one of ordinary skill in the art.

Furthermore, as a conveying member, the present invention is not restricted to a blade. Any member may be used, as long as it can constitute the bottom surface of the guide groove and it can move forward and backward. However, when a thin member like a blade is used, since weight reduction can be achieved, the influence of inertia at the time of reciprocating movement can be made small.

A component which can be conveyed by this invention is not restricted to a chip component of a square shape. As long as it is a component which is aligned and can be conveyed inside the guide groove, components of any shape can be used in the present invention.

As it is clear by the above description, isolation of the head component from the consecutive components can be performed more reliably with a component conveying device of the present invention by moving the conveying member forward by a predetermined distance after the first stopper holds the second component, since the head component is separated from the second component using a friction force between the conveying member and the head component. Indeed, as the device conveys the head component forward with the friction force caused by the combined force of the attraction power of the magnetic force generating part and gravity, compared with a system only using friction by gravity, or a conventional system only using magnetism, even when the velocity of conveying forward is increased, it is difficult to cause the components to skid, and thus separation reliability is high.

While the invention has been described in detail with reference to preferred embodiments thereof, it will be apparent to one skilled in the art that various changes can be made, and equivalents employed, without departing from the scope of the invention.

What is claimed is:

1. A device useful for conveying a component which is magnetically attractable, the device comprising:

a guide groove for guiding and aligning a component in a single line, the guide groove extending along a longitudinal direction and including a bottom surface and a tip portion;

a conveying member disposed on the bottom surface of the guide groove and having a magnetic force generating element for magnetically attracting the component, the conveying member being longitudinally movable in the groove to convey the component forward;

a driving means for reciprocally and longitudinally driving the conveying member;

a first stopper movable in synch with the reciprocating movement of the conveying member for holding a second component in a fixed position in the guide groove;

wherein after the first stopper holds the second component, when the conveying member moves longitudinally forward by a predetermined distance, a first component is integrally conveyed forward with the conveying member by a total friction force from the combined force of the attraction power of the magnetic force generating element and gravity, thereby isolating the first component from the second component.

2. A component conveying device according to claim 1, wherein the magnetic force generating element is positioned on the conveying member at a location which corresponds to a location of a first component when a second component is held by the first stopper.

3. A component conveying device according to claim 1, wherein the driving means causes reciprocating movement of the conveying member so that the speed of longitudinally moving backward is greater than the speed of longitudinally moving forward, the speed of longitudinally moving the conveying member forward being a velocity at which a friction force causes a component on the conveying member to move integrally with the conveying member, and the speed of longitudinally moving the conveying member backward being a velocity at which relative movement is causes between the conveying member and a component on the conveying member by skidding.

4. A component conveying device according to claim 1, further comprising a second stopper at a tip portion of the guide groove, the second stopper being longitudinally movable for stopping a first component in the guide groove, the second stopper including a mechanism to move the second stopper forward with the conveying member just before the completion of forward movement of the conveying member, the mechanism causing the second stopper to move backward with backward movement of the conveying member.

5. A component conveying device according to claim 4, wherein the second stopper is mounted in the device to pivot in a plane which includes the longitudinally direction.

6. A component conveying device according to claim 1, wherein the conveying member comprises a thin plate having a top surface which forms the bottom surface of the guide groove.

7. A component conveying device according to claim 1, wherein the first stopper comprises a lever mounted in the device to pivot relative to the guide groove, the lever including a portion extending laterally toward the guide groove.

8. A component conveying device according to claim 7, wherein the conveying member includes a slot having two ends and extending through the conveying member at an angle to the longitudinal direction, the first stopper including a ball received in the slot, the ball being sized and the lever having a profile so that the ball engages the lever when the ball is at one end of the slot and does not engage the lever when the ball is at another end of the slot.

9. A component conveying device according to claim 1, wherein the conveying member comprises a movable cammed surface, a cam follower pivotally mounted in the device to follow the cammed surface, the conveying member including a portion which engages the cam follower.

10. A method of conveying a component comprising the steps of:

aligning a first component having a magnetic part in a single line to guide the first component to a guide groove;

conveying the first component forward by a conveying member disposed on a bottom surface of the guide groove, the conveying member having a magnetic force generating element for attracting the magnetic part of the first component and moving backward and forward in the groove direction;

holding a second component at a predetermined position of the guide groove by a first stopper which operates in synch with the backward and forward movement of the conveying member; and moving the conveying member forward by a predetermined distance, the first component being attracted by the magnetic force generating element and being conveyed forward integrally with the conveying member, so that the first component is separated from the second component.

11. A method of conveying a component according to claim 10, wherein the magnetic force generating element is located at a position of the conveying member corresponding to the location of the first component when the second component is held by the first stopper.

12. A method of conveying a component according to claim 10, wherein the conveying member is driven such that a retraction speed is greater than a forward speed, the forward speed of the conveying member being a velocity at which a friction force between the conveying member and the first component moves the first component integrally with the conveying member, the retraction speed of the conveying member being a velocity at which relative movement is caused between the conveying member and the first component by skidding.

13. A method of conveying a component according to claim 10, wherein a second stopper which is movable backward and forward for stopping the first component is provided at a tip portion of the guide groove, and further comprising the step of moving the second stopper forward integrally with the conveying member just before completion of forward movement of the conveying member, so that the second stopper is made to move backward integrally with the backward movement of the conveying member.

* * * * *